(12) United States Patent
Yeh et al.

(10) Patent No.: US 10,412,827 B1
(45) Date of Patent: Sep. 10, 2019

(54) METHOD OF MAKING A RIGID-FLEX CIRCUIT BOARD

(71) Applicants: QING DING PRECISION ELECTRONICS (HUAIAN) CO.,LTD, Huai an (CN); Avary Holding (Shenzhen) Co., Limited., Shenzhen (CN)

(72) Inventors: Tzu-Chien Yeh, New Taipei (TW); Lin-Jie Gao, Huaian (CN)

(73) Assignees: QING DING PRECISION ELECTRONICS (HUAIAN) CO., LTD, Huai an (CN); Avary Holding (Shenzhen) Co., Limited., Shenzhen (CN)

( * ) Notice: Subject to any disclaimer, the term of this patent is extended or adjusted under 35 U.S.C. 154(b) by 0 days.

(21) Appl. No.: 16/147,602

(22) Filed: Sep. 29, 2018

(30) Foreign Application Priority Data

Aug. 28, 2018 (CN) .......................... 2018 1 0988875

(51) Int. Cl.
| | |
|---|---|
| *H05K 3/20* | (2006.01) |
| *H05K 1/02* | (2006.01) |
| *H05K 1/14* | (2006.01) |
| *H05K 3/28* | (2006.01) |
| *H05K 3/46* | (2006.01) |

(52) U.S. Cl.
CPC ........... *H05K 1/0298* (2013.01); *H05K 1/147* (2013.01); *H05K 3/288* (2013.01); *H05K 3/4691* (2013.01); *Y10T 29/49128* (2015.01)

(58) Field of Classification Search
CPC .... H05K 1/0298; H05K 3/4691; H05K 1/147; H05K 3/288; H01L 21/4857; H01L 21/4867; Y10T 29/49128; Y10T 29/49155
USPC ................................................... 29/831, 846
See application file for complete search history.

(56) References Cited

U.S. PATENT DOCUMENTS

| | | | | |
|---|---|---|---|---|
| 6,898,850 | B2 * | 5/2005 | Kanzawa ............ | H01L 21/4867 29/846 |
| 6,902,949 | B2 * | 6/2005 | Yamazaki ........... | H01L 21/4857 174/254 |
| 9,125,307 | B2 * | 9/2015 | Ozeki .................. | H05K 3/4655 |
| 2018/0139842 | A1 | 5/2018 | Xu et al. | |

FOREIGN PATENT DOCUMENTS

| | | |
|---|---|---|
| CN | 201274603 Y | 7/2009 |
| CN | 102555323 A | 7/2012 |
| CN | 107920415 A | 4/2018 |

* cited by examiner

*Primary Examiner* — Donghai D Nguyen
(74) *Attorney, Agent, or Firm* — ScienBiziP, P.C.

(57) ABSTRACT

A rigid-flex circuit board includes a core substrate, a first outer conductive circuit layer, and a second outer conductive circuit layer. The core substrate includes a first base layer and a second base layer. A first conductive circuit layer is formed on a surface of the first base layer, and a second conductive circuit layer is formed on a surface of the second base layer. An insulating layer is located between the first base layer and the second base layer. The first conductive circuit layer and the second conductive circuit layer are embedded within the insulating layer. A portion of the core substrate located within the first opening and the second opening is defined as a flexible board section, and the portions of the core substrate located outside of the first opening and the second opening are defined as a hard board section.

6 Claims, 6 Drawing Sheets

METHOD OF MAKING A RIGID-FLEX CIRCUIT BOARD

FIELD

The subject matter herein generally relates to circuit boards, and more particularly to a rigid-flex circuit board and a method of making the rigid-flex circuit board.

BACKGROUND

A size of electronic devices is heavily influenced by a size of a circuit board of the electronic devices. As electronic devices trend toward miniaturization of components, the size of the circuit boards is required to be reduced accordingly.

Therefore, there is room for improvement within the art.

BRIEF DESCRIPTION OF THE DRAWINGS

Implementations of the present disclosure will now be described, by way of example only, with reference to the attached figures.

DETAILED DESCRIPTION

Figure 1:
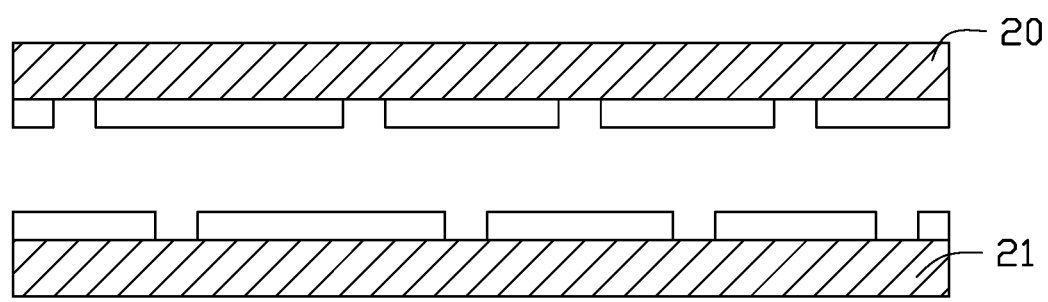
FIG. 1 is a cross-sectional view of a first base layer and a second base layer coated with photosensitive material.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series and the like.

A method for making a rigid-flex circuit board 100 is described below with reference to FIGS. 1-6.

FIG. 1 shows a first step. A first base layer 20 and a second base layer 21 are provided. A structure of the first base layer 20 is similar to a structure of the second base layer 21. Photosensitive material (not labeled) is coated on a surface of the first base layer 20 and on a surface of the second base layer 21. The photosensitive material is exposed to form a circuit pattern (represented by gaps in the photosensitive material).

In one embodiment, the photosensitive material is coated on the surfaces of the first base layer 20 and the second base layer 21. In other embodiments, the photosensitive material is formed on the surface of the first base layer 20 and the second base layer 21 by other methods, such as by printing. The first base layer 20 and the second base layer 21 are made of insulating material. The insulating material is selected from one or more of polyimide (PI), polyethylene terephthalate, liquid crystal polymer, and polyethylene naphthalate).

Figure 2:
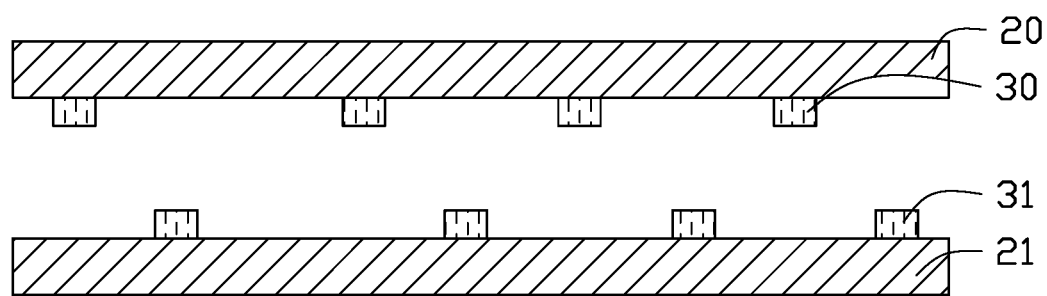
FIG. 2 is a cross-sectional view of the first base layer and the second base layer in FIG. 1 having a first conductive circuit layer and a second conductive circuit layer.

FIG. 2 shows a second step. Conductive material is coated within the exposed portions of the photosensitive material. The conductive material is made of conductive monomers and a copper sulphate solution. The photosensitive material is removed, and the conductive material is ultraviolet-cured to form a first conductive circuit layer 30 and a second conductive circuit layer 31. The conductive monomers are polymerized, and the first conductive circuit layer 30 and the second conductive circuit layer 31 are made of high-polymer material and metal particles.

The conductive material is solidified by UV-curing, thereby avoiding a high-temperature processing and avoiding risk of damaging the high-polymer material.

The first base layer 20 and the second base layer 21 are made of high-polymer material, such as PI or other insulating material, to ensure a high bonding strength between the first base layer 20 and the first conductive circuit layer 30 and the second base layer 21 and the second conductive circuit layer 31.

Figure 3:
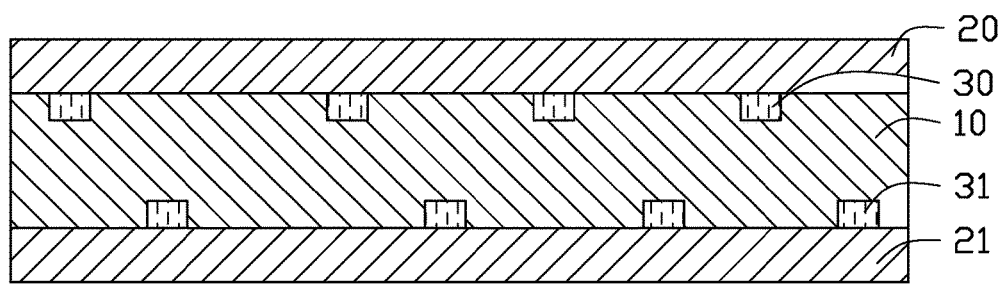
FIG. 3 is a cross-sectional view of the first base layer, the second base layer, the first conductive circuit layer, the second conductive circuit layer, and an insulating layer to form a core substrate.

FIG. 3 shows a third step. An insulating layer 10 is provided between the first base layer 20 and the second base layer 21, and the first base layer 20 and the second base layer 21 are laminated with the insulating layer 10 to form a core substrate 1. The first conductive circuit layer 30 and the second conductive circuit layer 31 are embedded within the insulating layer 10, and the first base layer 20 and the second base layer 21 are positioned at opposite sides of the insulating layer 10.

In one embodiment, the insulating layer 10 is made of adhesive material. The material of the insulating layer 10 is selected from one or more of polypropylene, epoxy resin, polyurethane, phenolic resin, urea resin, melamine-formaldehyde resin, and polyimide. In other embodiments, the adhesive material may be selected from other materials known in the art.

Figure 4:
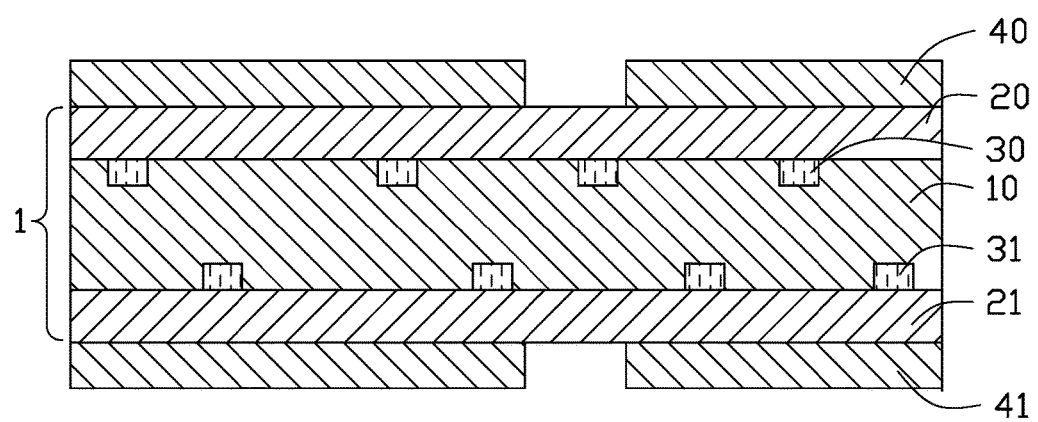
FIG. 4 is a cross-sectional view of the core substrate in FIG. 3 having a first adhesive layer and a second adhesive layer.

FIG. 4 shows a fourth step. A first adhesive layer 40 and a second adhesive layer 41 are provided. The first adhesive layer 40 defines a first opening 401. The second adhesive layer 41 defines a second opening 411. The first adhesive layer 40 is laminated onto a surface of the first base layer 20 opposite to the first conductive circuit layer 30. The second adhesive layer 41 is laminated onto a surface of the second base layer 21 opposite to the second conductive circuit layer 31. The first adhesive layer 40 and the second adhesive layer 41 are located at opposite sides of the core substrate 1.

Figure 5:
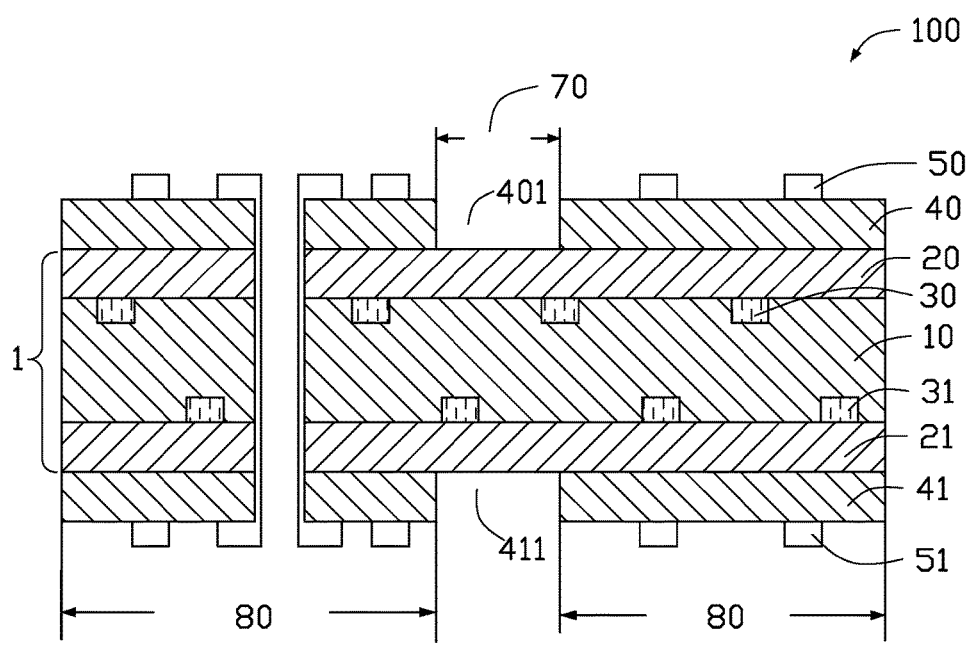
FIG. 5 is a cross-sectional view of the core substrate, the first adhesive layer, the second adhesive layer, a first outer conductive circuit layer, a second outer conductive circuit layer, and a conductive via.

FIG. 5 shows a fifth step. Two copper films (not labeled) defining an opening are provided. A first copper film is laminated onto a surface of the first adhesive layer 40 opposite to the first base layer 20, and a second copper film is laminated onto a surface of the second adhesive layer 41 opposite to the second base layer 21.

The first copper film is circuit-configured to form a first outer conductive circuit layer 50, and the second copper film is circuit-configured to form a second outer conductive circuit layer 51. A conductive via (not labeled) is formed to electrically interconnect the first conductive circuit layer 30, the second conductive circuit layer 31, the first outer conductive circuit layer 50, and the second outer conductive circuit layer 51, thereby forming the rigid-flex circuit board 100.

The first outer conductive circuit layer 50 defines an opening (not labeled) aligned with the first opening 401, and the second outer conductive circuit layer 51 defines an opening (not labeled) aligned with the second opening 411. The first base layer 20 is exposed through the first opening 401, the second base layer 21 is exposed through the second opening 411, and the first opening 401 and the second opening 411 are opposite each other across the core substrate 1. A portion of the core substrate 1 located within the first opening 401 and the second opening 411 is defined as a flexible board section 70, and the portions of the core substrate 1 located outside of the first opening 401 and the second opening 411 are defined as a hard board section 80.

Figure 6:
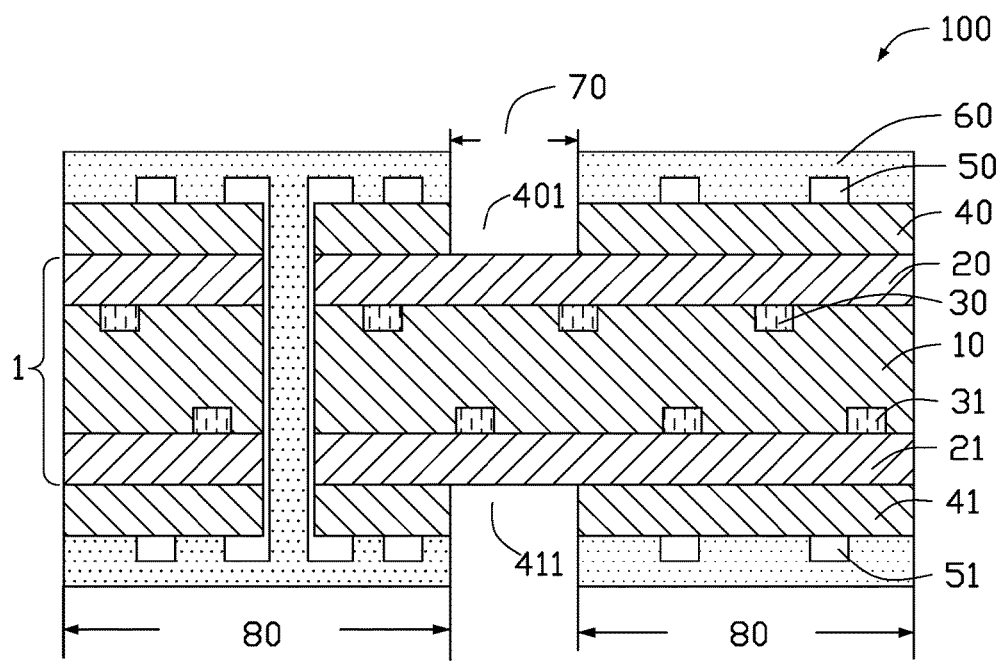
FIG. 6 is a cross-sectional view of FIG. 5 having a solder mask layer formed over the first outer conductive circuit layer and the second outer conductive circuit layer.

FIG. 6 shows a solder mask layer 60 formed over the first outer conductive circuit layer 50 and the second outer conductive circuit layer 51. The solder mask layer 60 covers over the first outer conductive circuit layer 50 and the second outer conductive circuit layer 51 and fills in the first opening 401 and the second opening 411.

In other embodiments, after step S5, steps S1-S5 may be repeated to form a multi-layered rigid-flex circuit board.

The rigid-flex circuit board 100 includes the core substrate 1. The core substrate 1 includes the first base layer 20, the second base layer 21, the first conductive circuit layer 30 formed on the surface of the first base layer 20, the second conductive circuit layer 31 formed on the surface of the second base layer 21, and the insulating layer 10 between the first base layer 20 and the second base layer 21. The first conductive circuit layer 30 and the second conductive circuit layer 31 are embedded within the insulating layer 10.

The first adhesive layer 40 is formed on the surface of the first base layer 20 opposite to the first conductive circuit layer 30, and the second adhesive layer 41 is formed on the surface of the second base layer 21 opposite to the second conductive circuit layer 31. The first adhesive layer 40 defines the first opening 401, and the second adhesive layer 41 defines the second opening 411. The first base layer 20 is exposed through the first opening 401, and the second base layer 21 is exposed through the second opening 411.

The first outer conductive circuit layer 50 is formed on the outer surface of the first adhesive layer 40 opposite to the first base layer 20, and the second outer conductive circuit layer 51 is formed on the outer surface of the second adhesive layer 41 opposite to the second base layer 21. The first outer conductive circuit layer 50 defines an opening aligned with the first opening 401, and the second outer conductive circuit layer 51 defines an opening aligned with the second opening 411.

The portion of the core substrate 1 located within the first opening 401 and the second opening 411 is defined as the flexible board section 70, and the portions of the core substrate 1 located outside of the first opening 401 and the second opening 411 are defined as the hard board section 80.

The first conductive circuit layer 30 and the second conductive circuit layer 31 are made of conductive composite material composed of high-polymer material and metal particles.

The solder mask layer 60 is formed on an outer surface of the first outer conductive circuit layer 50 and on an outer surface of the second outer conductive circuit layer 51 opposite to the core substrate 1.

The rigid-flex circuit board 1 forms the conductive via for electrically interconnecting the first conductive circuit layer 30, the second conductive circuit layer 31, the first outer conductive circuit layer 50, and the second outer conductive circuit layer 51.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A method of making a rigid-flex circuit board, the method comprising:
providing a first base layer and a second base layer, coating a photosensitive material on a surface of the first base layer and on a surface of the second base layer, and exposing the photosensitive material to form a circuit pattern;
coating a conductive material on the exposed portions of the surface of both the first base layer and the second base layer, removing the photosensitive material outside of the conductive material, and solidifying the conductive material to form a first conductive circuit layer on the first base layer and a second conductive circuit layer on the second base layer;
providing an insulating layer and laminating the insulating layer between the first base layer and the second base layer to form a core substrate, the first conductive circuit layer and the second conductive circuit layer embedded within the insulating layer;
providing a first adhesive layer, the first adhesive layer defining a first opening, and laminating the first adhesive layer to an outer surface of the first base layer, the first adhesive layer located on a surface of the first base layer opposite to the first conductive circuit layer, the first base layer exposed through the first opening;
providing and laminating a first copper film on a surface of the first adhesive layer opposite to the first base layer, forming a first outer conductive circuit layer from the first copper film, the first copper film defining an opening aligned with the first opening; and
wherein a portion of the core substrate located within the first opening is defined as a flexible board section, and the portions of the core substrate located outside of the first opening are defined as a hard board section.

2. The method of claim 1, further comprising:
providing a second adhesive layer, the second adhesive layer defining a second opening, laminating the second adhesive layer to an outer surface of the second base layer, the second adhesive layer located on a surface of the second base layer opposite to the second conductive circuit layer, and the second base layer exposed through the second opening; and providing a second copper film, laminating the second copper film on a surface of the second adhesive layer opposite to the second substrate, and forming a second outer conductive circuit layer from the second copper film, the second copper film defining an opening aligned with the second opening.

3. The method of claim 2, wherein the first opening and the second opening are directly opposite each other across the first base layer and the second base layer.

4. The method of claim 2, further comprising:
forming a solder mask layer on a surface of the first outer conductive circuit layer facing away from the core substrate; and forming a solder mask layer on a surface of the second outer conductive circuit layer facing away from the core substrate.

5. The method of claim 2, wherein the first conductive circuit layer and the second conductive circuit layer are made of high-polymer material and metal particles.

6. The method of claim 2, wherein the first conductive circuit layer and the second conductive circuit layer are solidified by ultraviolet light.

* * * * *